(12) United States Patent
Kuge

(10) Patent No.: US 7,772,883 B2
(45) Date of Patent: Aug. 10, 2010

(54) LEVEL SHIFTER

(75) Inventor: Hiroyuki Kuge, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 8 days.

(21) Appl. No.: 12/219,428

(22) Filed: Jul. 22, 2008

(65) Prior Publication Data
US 2009/0027082 A1 Jan. 29, 2009

(30) Foreign Application Priority Data
Jul. 25, 2007 (JP) .............................. 2007-193516

(51) Int. Cl.
*H03K 19/0175* (2006.01)
*H03L 5/00* (2006.01)
(52) U.S. Cl. ............................ 326/63; 326/80; 327/333
(58) Field of Classification Search .................. 326/62, 326/63, 83, 86, 87, 12, 115, 126, 127; 327/108, 327/109, 333
See application file for complete search history.

(56) References Cited

U.S. PATENT DOCUMENTS

| 4,845,381 | A |   | 7/1989  | Cuevas |   |
|---|---|---|---|---|---|
| 5,781,026 | A | * | 7/1998  | Chow .......................... | 326/26 |
| 6,445,210 | B2 |   | 9/2002  | Nojiri |   |
| 6,445,226 | B2 | * | 9/2002  | Taniguchi ................... | 327/112 |
| 6,670,841 | B2 | * | 12/2003 | Kobayashi .................. | 327/333 |
| 6,744,298 | B2 | * | 6/2004  | Yamauchi et al. ........... | 327/333 |
| 7,112,996 | B2 | * | 9/2006  | Lee ............................. | 326/68 |
| 7,239,191 | B2 | * | 7/2007  | Lee ............................. | 327/333 |
| 2003/0080787 | A1 | * | 5/2003 | Yamauchi et al. ........... | 327/108 |
| 2008/0246529 | A1 | * | 10/2008 | Hishikawa et al. .......... | 327/333 |

FOREIGN PATENT DOCUMENTS

JP      2004-7821      1/2004
JP      2004-363740      12/2004

* cited by examiner

*Primary Examiner*—Rexford N Barnie
*Assistant Examiner*—Dylan White
(74) *Attorney, Agent, or Firm*—McGinn IP Law Group, PLLC

(57) ABSTRACT

A level shifter is operated at high speed. An input unit 2 generates a first one-shot pulse signal at the rise of an input signal and a second one-shot pulse signal having the same polarity as the first one-shot pulse signal at the fall of the input signal, and eliminates the generated first and second one-shot pulse signals using an output signal. A level shift unit 3 includes a level shift circuit LS1 that converts the signal level of the first one-shot pulse signal and a level shift circuit LS2 that converts the signal level of the second one-shot pulse signal. An output unit 4 is driven corresponding to the first and second one-shot pulse signals whose levels have been shifted and generates the output signal. A hold unit 1 maintains the level of the generated output signal.

20 Claims, 9 Drawing Sheets

FIG. 2

| INPUT | | OUTPUT | |
|---|---|---|---|
| IN2 | OUT2 | N3 | N4 |
| 0 | 0 | 0 | 0 |
| 1 | 0 | 1 | 0 |
| 1 | 1 | 0 | 0 |
| 0 | 1 | 0 | 1 |

LEVEL SHIFTER

REFERENCE TO RELATED APPLICATION

This application is based upon and claims the benefit of the priority of Japanese patent application No. 2007-193516 filed on Jul. 25, 2007, the disclosure of which is incorporated herein in its entirety by reference thereto.

TECHNICAL FIELD

The present invention relates to a level shifter that functions as an interface between circuits operating at different power supply voltages.

BACKGROUND

In mobile products, the internal core voltages of the semiconductor devices need to be lowered in order to reduce the power consumption. Meanwhile, I/O buffers need to perform a level shift between the internal core voltage and the I/O voltage. A level shifter applicable to such an I/O buffer is disclosed in Patent Document 1.

FIG. 8 is a circuit diagram of the level shifter disclosed in Patent Document 1. In FIG. 8, the level shifter is formulated by PMOS transistors MP101, MP102, MP103, and MP104, NMOS transistors MN101 and MN102, and inverters INV101, INV102, and INV103. The PMOS transistor MP101 has its source connected to a power supply VDDQ and its gate connected to an output node N91 of a cross-connected section. The PMOS transistor MP102 has its source connected to a drain of the PMOS transistor MP101 and its gate connected to a node N93, which is an output of the inverter INV101. The NMOS transistor MN101 has its source grounded, its drain connected to a node N92, which is a drain of the PMOS transistor MP102, and its gate connected to the node N93, which is the output of the inverter INV101.

The PMOS transistor MP103 has its source connected to the power supply VDDQ and its gate connected to the node N92. The PMOS transistor MP104 has its source connected to a drain of the PMOS transistor MP103 and its gate connected to a node N94, which is an output of the inverter INV102. The NMOS transistor MN102 has its source grounded, its drain connected to the output node N91 of the cross-connected section, which is a drain of the PMOS transistor MP104, and its gate connected to the node N94.

The inverter INV101 has its input connected to an input terminal IN and receives power supply voltage VDD. The inverter INV102 has its input connected to the node N93, which is the output of the inverter INV101, and receives the power supply voltage VDD. The inverter INV103 has its input connected to the output node N91 of the cross-connected section, its output connected to an output terminal OUT, and receives the power supply voltage VDDQ.

Further, as a related technology, a level shifter capable of reducing the power consumption by eliminating pass-through current is described in Patent Document 2.

Further, as a related technology, a level shifter that operates at high speed without using a latch structure for level shifting and that consumes low power is described in Patent Document 3.

[Patent Document 1] U.S. Pat. 4,845,381
[Patent Document 2] Japanese Patent Kokai Publication No. JP-P2004-363740A
[Patent Document 3] Japanese Patent Kokai Publication No. JP-P2004-7821A

SUMMARY OF THE DISCLOSURE

The following analysis is given by the present invention.
FIG. 9 is a timing chart of the level shifter shown in FIG. 8. First, the operation when the level at a node IN rises will be described. Further, we'll assume that VDD=1.2V and VDDQ=1.8V.

When the level at the node IN rises at time TC1, a signal is inverted by the inverter INV101 and after time TC2, which is a delay time of the inverter INV101, has elapsed, the level at the node N93 falls. As a result, a falling signal is supplied to the gates of the NMOS transistor MN101 and the PMOS transistor MP102. Further, the signal is reinverted by the inverter INV102 and after time TC3, which is a delay time of the inverter INV102, the level at the node N94 rises. As a result, a rising signal is supplied to the gates of the NMOS transistor MN102 and the PMOS transistor MP104. Since the NMOS transistor MN102 is turned on at this time, the voltage at the node N91 drops after delay time TC4 has elapsed.

However, the input signal of the PMOS transistor MP104 only rises to the level of VDD=1.2V at the gate and the PMOS transistor MP104 does not get turned off completely. Therefore, the voltage at the node N91 drops to V1, the result of voltage division by the on-resistances of the PMOS transistors MP103 and MP104 and the NMOS transistor MN102. Meanwhile, after delay time TC5 has elapsed, the PMOS transistor MP101 is turned on, and a falling signal is fed to the gates of the NMOS transistor MN101 and the PMOS transistor MP102 at this time. As a result, the NMOS transistor MN101 and the PMOS transistor MP102 are in an OFF state and in an ON state respectively and the voltage at the node N92 rises to the level of VDDQ=1.8V. Because of this, the PMOS transistor MP103 is in a complete OFF state, the level at the node N91 drops to 0V, and the level at the output terminal OUT rises after a delay time TC6 of the inverter INV103 has elapsed.

Next, the operation when the level at the node IN falls will be described. When the level at the node IN drops at time TD1, a signal is inverted by the inverter INV101 and after time TD2, which is a delay time of the inverter INV101, has elapsed, the level at the node N93 rises. As a result, a rising signal is supplied to the gates of the NMOS transistor MN101 and the PMOS transistor MP102. Further, the signal is reinverted by the inverter INV102 and after time TD3, which is a delay time of the inverter INV102, the level at the node N94 falls. As a result, a falling signal is supplied to the gates of the NMOS transistor MN102 and the PMOS transistor MP104. Since the NMOS transistor MN101 is turned on at this time, the voltage at the node N92 drops after delay time TD4 has elapsed.

However, the input signal of the PMOS transistor MP102 only rises to the level of VDD=1.2V at the gate and the PMOS transistor MP102 does not get turned off completely. Therefore, the voltage at the node N92 drops to V2, the result of voltage division by the on-resistances of the PMOS transistors MP101 and MP102 and the NMOS transistor MN100. Meanwhile, after delay time TD5 has elapsed, the PMOS transistor MP103 is turned on, and a falling signal is fed to the gates of the NMOS transistor MN102 and the PMOS transistor MP104 at this time. As a result, the NMOS transistor MN102 and the PMOS transistor MP104 are in an OFF state and in an ON state respectively and the voltage at the node N91 rises to the level of VDDQ=1.8V. Because of this, the PMOS transistor MP10 is in a complete OFF state, the level at the node N92 drops to 0V, and the level at the output terminal OUT falls after a delay time TD6 of the inverter INV103 has elapsed.

Meanwhile, in the level shifter shown in FIG. 8, the level at the node N91 rises because of the sufficient voltage drop at the node N92 after the time TD1. The voltage at the node N92 is the result of the voltage division by the on-resistances of the PMOS transistors MP101 and MP102 and the NMOS transistor MN101. Therefore, when the on-resistance of the NMOS transistor MN101 increases, the voltage at the node N92 does not sufficiently drop and the level at the node N91 does not rise. The increase in the on-resistance of the NMOS transistor MN101 is caused by a decrease in the gate voltage of the NMOS transistor MN101, i.e., VDD. It means that the lower VDD gets, the worse the rising characteristics of the node N91 becomes. Since this circuit is symmetrical on both sides, the same could be said about the rising characteristics of the node N92.

One might think that, by increasing the W-sizes of the NMOS transistors MN101 and MN102, it is possible to perform a level shift even with a low VDD. In other words, the increase in the W-sizes of the NMOS transistors MN101 and MN102 will translate into a decrease in the on-resistance. As a result, since the voltages at the nodes N91 and N92 drop sufficiently, a level shift operation can be performed even when VDD is low.

This method, however, comes with a problem: the W-sizes of the PMOS transistors MP101, MP102, MP103, and MP104 cannot be increased and the rising characteristics of the nodes N91 and N92 will deteriorate. The reason why the W-sizes of the PMOS transistors MP101, MP102, MP103, and MP104 cannot be increased is that it will increase the voltages at the node N91 and N92.

Meanwhile, the falling characteristics of the nodes N91 and N92 will improve since the W-sizes of the NMOS transistors MN101 and MN102 are increased. Therefore, if the dimension of a transistor that operates at a low voltage is employed, the balance between the rising and falling characteristics will be poor. As a result, jitter characteristics of the circuit will deteriorate and high-speed level shift operation will not be possible. For instance, in the case of the DDR2 buffer, which is a recent memory interface standard, it is known that a jitter fluctuation of several tens of ps will influence the characteristics, and when the balance between the rising and falling characteristics deteriorates and a difference of several tens of ps occurs, the jitter characteristics deteriorate as well.

The problems described above occur due to the fact that transistors relating to the operation are different when the level at the node IN rises and when it falls and that the capability of each transistor is not consistent. In order to solve these problems, it is preferable to have a circuit in which the same kind of transistors of the same size operate both when the level rises and when it falls and let it perform a level shift operation. A technology described in Patent Document 2 can be used to create such a circuit, although the original purpose of the technology is different. However, if the circuit of Patent Document 2 is applied in order to improve the low voltage operation characteristics, which is an object of the present invention, since the circuit operates using condensers and it is susceptible to external noise that causes malfunction, the circuit will be unstable and unreliable. Providing a guard ring to prevent noise will increase the number of parts. Further, disposing the condensers of this circuit on an LSI chip may increase the block size since they require an area several tens times larger than normal logic elements. Thus, there is much to be desired in the art.

According to an aspect of the present invention, there is provided a level shifter comprising an input unit that generates a first one-shot pulse signal at the rise of an input signal and a second one-shot pulse signal having the same polarity as the first one-shot pulse signal at the fall of the input signal; and a level shift unit that includes a first level shift circuit that converts the signal level of the first one-shot pulse signal and a second level shift circuit that converts the signal level of the second one-shot pulse signal. The level shifter further comprises an output unit, driven corresponding to the first and second one-shot pulse signals whose levels have been converted, that generates an output signal; and a hold unit that holds the level of the generated output signal. The input unit causes the generated first and second one-shot pulse signals to disappear (eliminate) using the output signal.

The meritorious effects of the present invention are summarized as follows.

According to the present invention, the balance between the delay times of the rise and fall of an output signal can be improved since the output signal is generated by having first and second level shift circuits convert the signal levels of first and second one-shot pulse signals. As a result, it is possible to have the level shifter operate at high speed.

BRIEF DESCRIPTIONS OF THE DRAWINGS

FIG. 2 is a truth table of the input/output in an input unit.

PREFERRED MODES OF THE INVENTION

Figure 1:
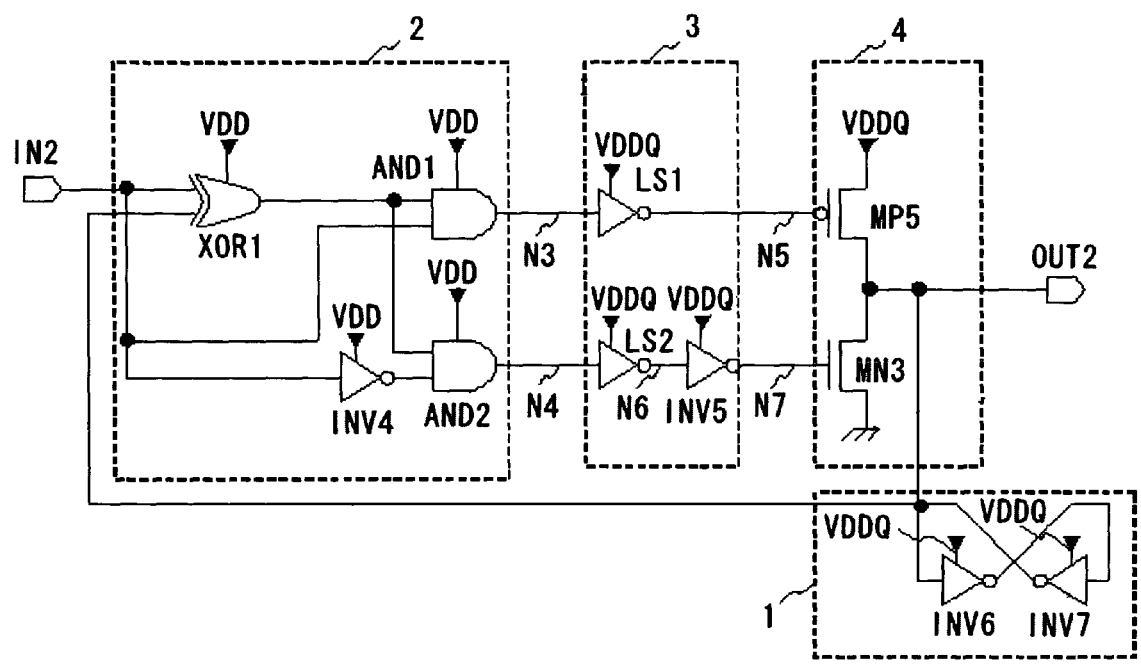
FIG. 1 is a circuit diagram of a level shifter relating to a first example of the present invention.

A level shifter relating to an exemplary embodiment comprises an input unit, a level shift unit, an output unit, and a hold unit. The input unit generates a first one-shot pulse signal at the rise of an input signal and a second one-shot pulse signal having the same polarity as the first one-shot pulse signal at the fall of the input signal, and eliminates (causes to disappear or cancel) the generated first and second one-shot pulse signals using an output signal. The level shift unit includes a first level shift circuit that converts the signal level of the first one-shot pulse signal and a second level shift circuit that converts the signal level of the second one-shot pulse signal. The output unit is driven corresponding to the first and second one-shot pulse signals whose levels have been shifted and generates the output signal. The hold unit holds the level of the generated output signal.

In the level shifter of the present invention, it is preferable that the input unit determine whether or not the logic levels of the input signal and the output signal coincide with each other; the input unit generates the first one-shot pulse signal corresponding to the rising edge of the input signal and the second one-shot pulse signal corresponding to the falling edge of the input signal when it is determined that the logic levels do not coincide; and the logic level of the output signal change corresponding to the generation timing of the first and second one-shot pulse signals in the output unit.

In the level shifter of the present invention, it is preferable that each of the first and second level shift circuits comprises a transistor of a first conductivity type having its gate receiving the first and second one-shot pulse signals respectively, its source connected to a first power supply, and its drain output a one-shot pulse signal whose level has been converted; and a first transistor of a second conductivity type having its gate connected to the gate of the transistor of the first conductivity type, its drain connected to the drain of the transistor of the first conductivity type, and its source connected to a second power supply via a connected transistor group; and that the connected transistor group be formulated by one or two or more transistor(s) of the second conductivity type.

In the level shifter of the present invention, the connected transistor group may be a second transistor of the second conductivity type having its gate connected to the gate of the transistor of the first conductivity type or to the ground, its drain connected to the source of the first transistor of the second conductivity type, and its source connected to the second power supply.

In the level shifter of the present invention, the connected transistor group may be formulated by a second transistor of the second conductivity type having its gate connected to the gate of the transistor of the first conductivity type or to the ground and its drain connected to the source of the first transistor of the second conductivity type; and a third transistor of the second conductivity type having its gate connected to the gate of the transistor of the first conductivity type or to the ground, its drain connected to the source of the second transistor of the second conductivity type, and its source connected to the second power supply.

In the level shifter of the present invention, the connected transistor group may be formulated by a second transistor of the second conductivity type having its gate receiving an inverted signal of the drain of the transistor of the first conductivity type, its drain connected to the source of the first transistor of the second conductivity type, and its source connected to the second power supply; and a third transistor of the second conductivity type having its gate receiving a signal associated with the output signal, its drain connected to the source of the first transistor of the second conductivity type, and its source connected to the second power supply. An inverted signal of the output signal may be supplied to the gate of the third transistor of the second conductivity type in case where the connected transistor group is included in the first level shift circuit; whereas the output signal may be supplied to the gate of the third transistor of the second conductivity type in case where the connected transistor group is included in the second level shift circuit.

Examples of the present invention will be described in detail with reference to the drawings.

EXAMPLE 1

FIG. 1 is a circuit diagram of a level shifter relating to a first example of the present invention. In FIG. 1, the level shifter comprises a hold circuit 1, an input unit 2, a level shift unit 3, and an output inverting unit 4. The power supply for the input unit 2 is supplied from a power supply VDD on the low voltage side, and the respective power supply for the hold circuit 1, the level shift unit 3, and the output inverting unit 4 is supplied from a power supply VDDQ on the high voltage side.

The input unit 2 comprises an XOR circuit XOR1, an AND circuits AND1 and AND2, and an inverter circuit INV4, and all the circuits are connected to the power supply VDD. The XOR circuit XOR1 has its two input ends respectively connected to nodes IN2 and OUT2, and its output end respectively connected to one of input ends of the AND circuits AND1 and AND2. The AND circuit AND1 has the other input end connected to the node IN2 and its output end connected to a node N3. Further, the AND circuit AND2 has the other input end connected to the node IN2 via the inverter circuit INV4 and its output end connected to a node N4.

FIG. 2 is a truth table of the input/output in the input unit 2. In the logic between the input and the output in the input unit 2, the nodes N3 and N4 both become "0" when the logical values of the nodes IN2 and OUT2 are the same, as shown in FIG. 2. Further, when the logical values of the nodes IN2 and OUT2 do not match and the node IN2 is "1," only the node N3 becomes "1." Further, when the logical values of the nodes IN2 and OUT2 do not match and the node IN2 is "0," only the node N4 becomes "1." The circuit configuration of the input unit 2 is not limited to the circuit shown in FIG. 1 as long as it outputs the logical values in the truth table shown in FIG. 2.

The level shift unit 3 comprises level shift circuits LS1 and LS2 and an inverter circuit INV5, and all the circuits are connected to the power supply VDDQ. The level shift circuit LS1 has its input end connected to the node N3, which is the output of the AND circuit AND1, and its output end connected to the node N5. The level shift circuit LS2 has its input end connected to the node N4, which is the output of the AND circuit AND2, and its output end connected to the node N7 via the inverter circuit INV5.

Figure 3:
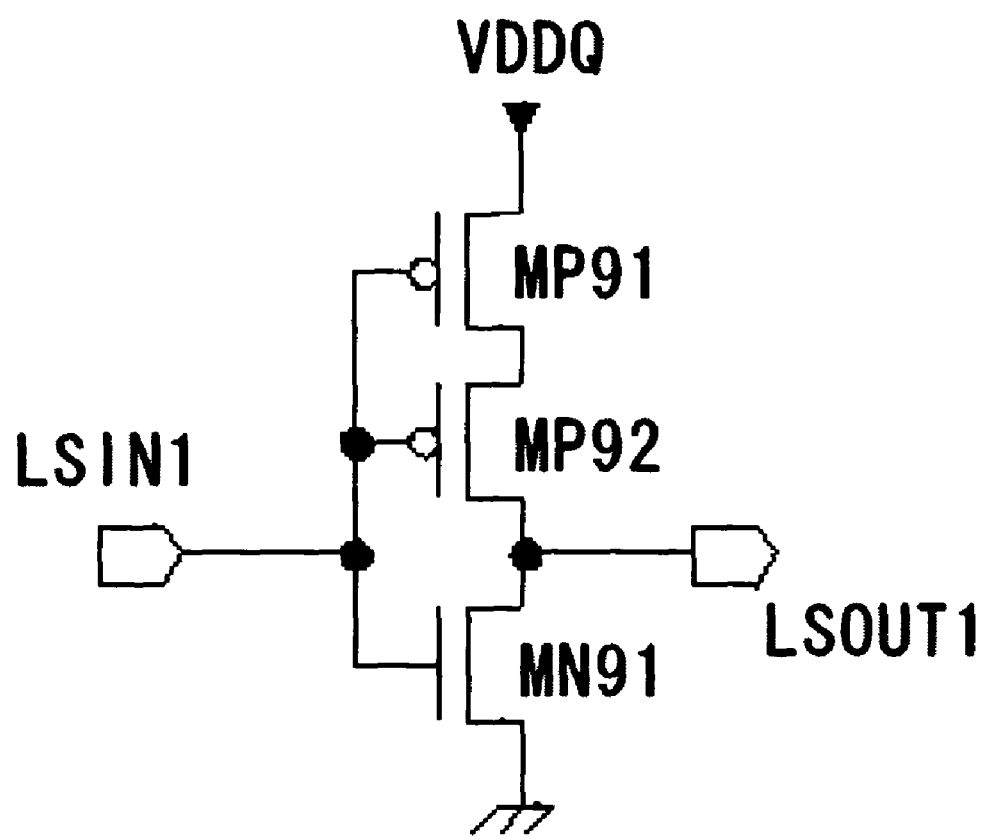
FIG. 3 is a circuit diagram of level shift circuits LS1 and LS2.

FIG. 3 is a circuit diagram of the level shift circuits LS1 and LS2. The level shift circuits LS1 and LS2 are formulated by P-channel transistors MP91 and MP92 and an N-channel transistor MN91, and gates of all the transistors are connected to an input end LSIN1. Drains of the P-channel transistor MP92 and the N-channel transistor MN91 are connected to an output end LSOUT1. Further, a drain of the P-channel transistor MP91 is connected to a source of the P-channel transistor MP92, a source of the P-channel transistor MP91 is connected to VDDQ, and a source of the N-channel transistor MN91 is connected to GND.

The level shift circuit configured as above shifts the level of a pulse signal, which is supplied to the input end LSIN1 and has a potential between VDD and the ground, to a potential between the ground (a potential near the ground in reality) and VDDQ, and outputs to the output end LSOUT1.

Figure 4:
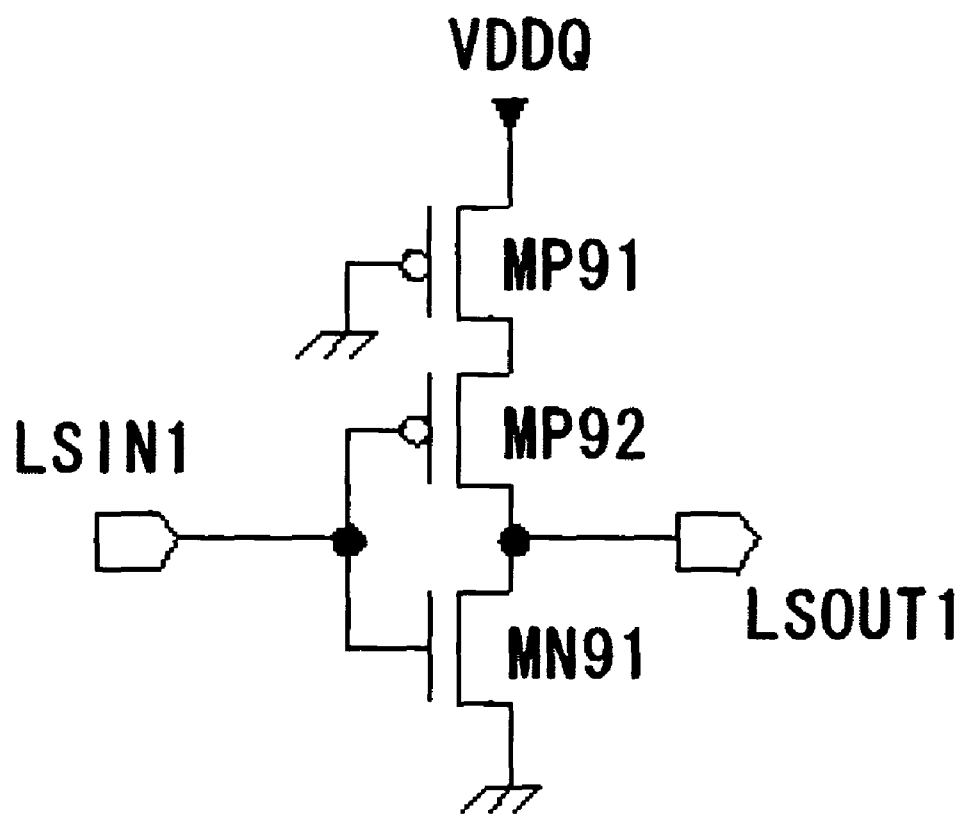
FIG. 4 is a circuit diagram showing another example of the level shift circuits LS1 and LS2.

Further, FIG. 4 is a circuit diagram showing another example of the level shift circuits LS1 and LS2. As shown in FIG. 4, the same results can be achieved by clamping (i.e., grounding) the gate input of the P-channel transistor MP91 in FIG. 3 to "0" level.

Figure 5:
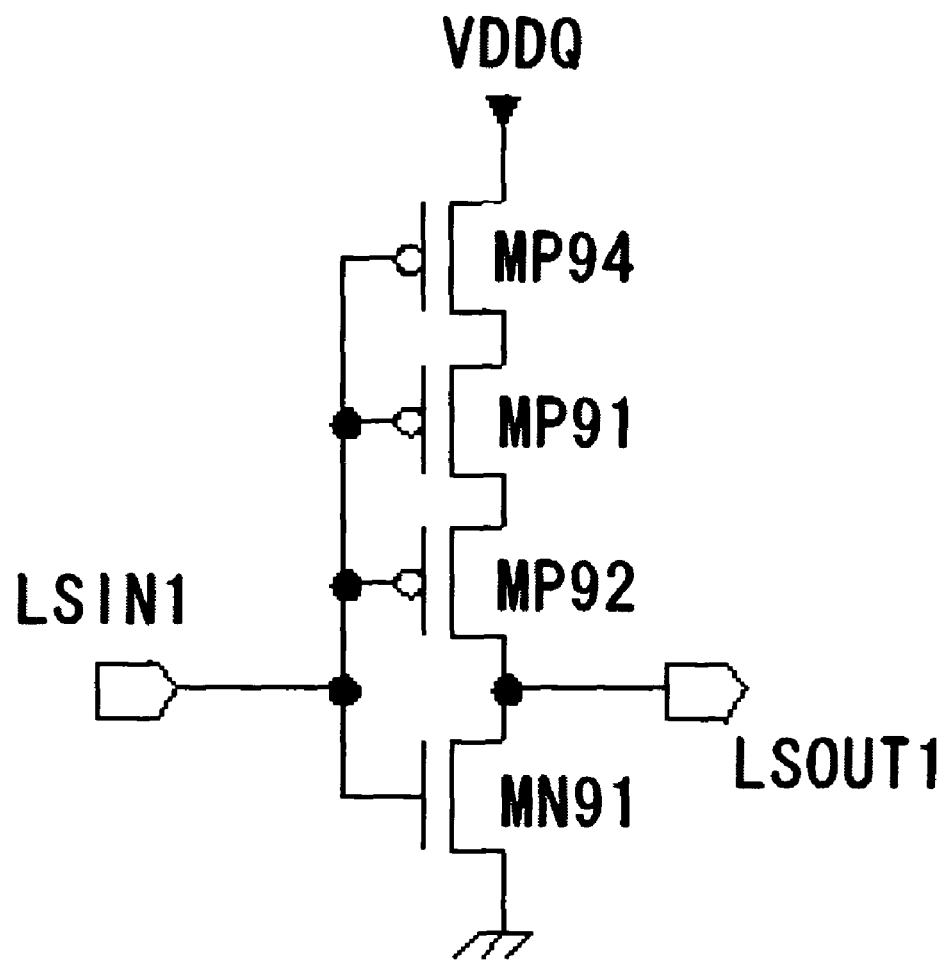
FIG. 5 is a circuit diagram showing yet another example of the level shift circuits LS1 and LS2.

Further, FIG. 5 is a circuit diagram showing yet another example of the level shift circuits LS1 and LS2. As shown in FIG. 5, the same results can be achieved by adding a P-channel transistor MP94, having its gate connected to the input end LSIN1, between the P-channel transistor MP91 and the power supply VDDQ in FIG. 3 and changing (increasing) the number of the vertical stages in the circuit. Further, in FIG. 5, the gate(s) of the P-channel transistors MP91 or MP94 or both may be clamped (grounded) to "0" level.

The output inverting unit 4 comprises a P-channel transistor MP5 and a N-channel transistor MN3. The N-channel transistor MN3 has its gate connected to the node N7, which is an output of the inverter circuit INV5, its source connected to GND, and its drain connected to the node OUT2. Further, the P-channel transistor MP5 has its gate connected to the node N5, which is the output of the level shift circuit LS1, its source connected to the power supply VDDQ, and its drain connected to the node OUT2.

The hold circuit 1 comprises inverter circuits INV6 and INV7 connected to the power supply VDDQ. The inverter circuit INV6 has its input end connected to the node OUT2 and its output end connected to an input end of the inverter circuit INV7. The inverter circuit INV7 has its output end connected to the node OUT2.

Figure 6:
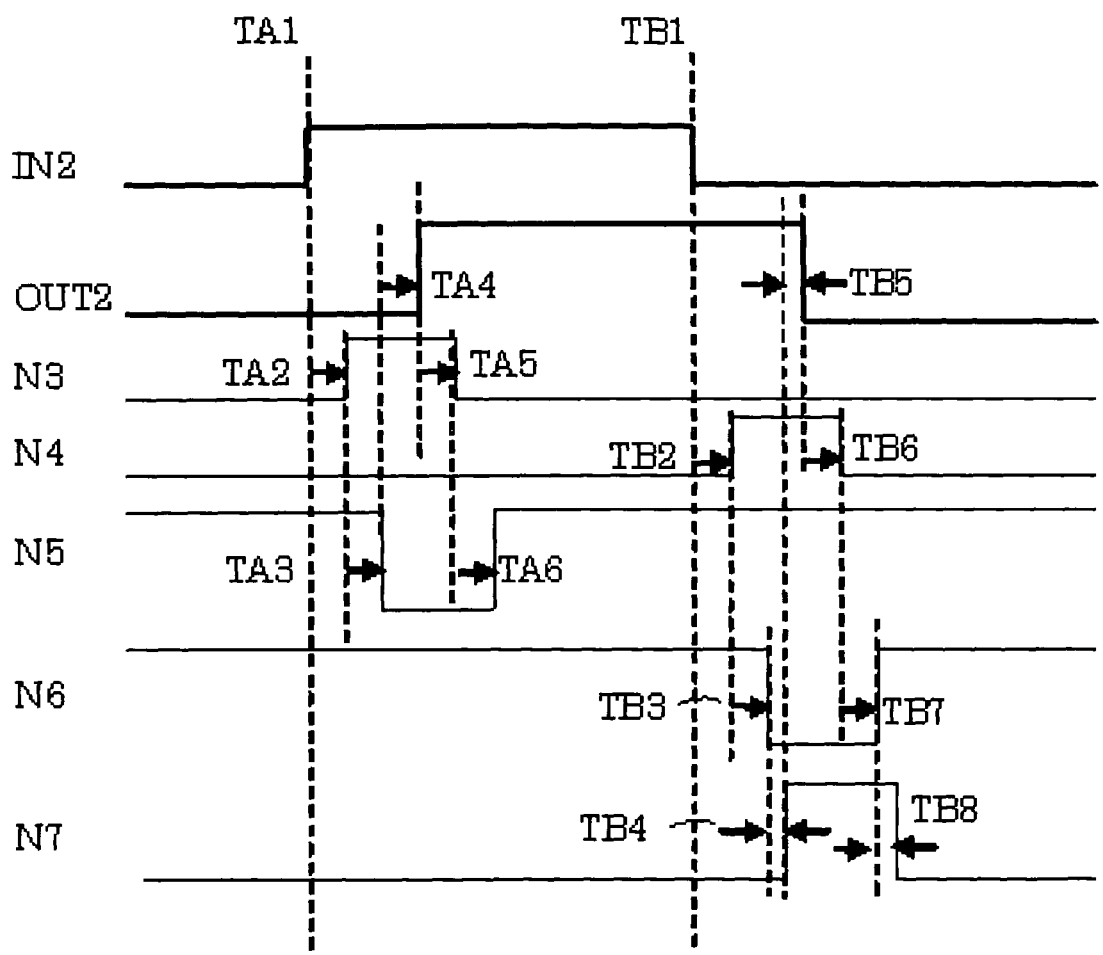
FIG. 6 is a timing chart showing the operation of the level shifter relating to the first example of the present invention.

Next, the operation of the level shifter will be described. FIG. 6 is a timing chart showing the operation of the level shifter relating to the first example of the present invention. Here, low level and high level are represented by "0" and "1" respectively.

In an initial state, IN2="0" and the nodes N3 and N4 are at "0" as well. At this time, since the voltage level of the node N5 is at VDDQ, the P-channel transistor MP5, having the voltage of VDDQ is applied to its gate, is in an OFF state. Further, the voltage level of the node N6 is VDDQ, the same as that of the node N5, and the voltage of the node N7 is inverted by the inverter circuit INV5 and at "0" level. Therefore, the N-channel transistor MN3, having a voltage of "0" level applied to its gate, is in an OFF state. The voltage of the output OUT2 is maintained at "0" level by the hold circuit 1.

When the input IN2 rises at time TA1, the level at the node N3 rises (becomes "1") after a delay time TA2 of an input unit 2 has elapsed, as shown in the truth table in FIG. 2. In other words, the voltage level at the node N3 is at VDD and the N-channel transistor MN91, having the voltage VDD applied to its gate, in the level shift circuit LS1 is turned on. As a result, the voltage at the node N5 is pulled down after a delay time TA3 of the level shift circuit LS1 has elapsed, and the P-channel transistor MP5 enters an ON state. When the P-channel transistor MP5 becomes the ON state, the voltage of the output OUT2 is pulled up after a delay time TA4 of the output inverting unit 4 has elapsed and the state of the hold circuit 1 (the level of the output OUT2) is inverted to the VDDQ level.

When the output OUT2 becomes the VDDQ level ("1" level), the node N3 becomes "0" level after a delay time TA5 of the input unit 2 has elapsed, as shown in the truth table in FIG. 2. Following this, the N-channel transistor MN91 in the level shift circuit LS1 is turned off after a delay time TA6 of the level shift unit 3 has elapsed. As a result, the node N5 becomes the VDDQ level and the P-channel transistor enters an OFF state. In this OFF state, the voltage of the output OUT2 is held at "1" level in the hold circuit 1.

When the input IN2 falls down at time TB1, the level at the node N4 rises (becomes "1") after a delay time TB2 of the input unit 2 has elapsed, as shown in the truth table in FIG. 2. In other words, the voltage level at the node N4 is at VDD and the N-channel transistor MN91, having the voltage VDD applied to its gate, in the level shift circuit LS2 is turned on. As a result, the voltage at the node N6 is pulled down after a delay time TB3 of the level shift circuit LS2 has elapsed, and the voltage at the node N7 is inverted by the inverter circuit INV5 to the VDDQ level after a delay time TB4 of the inverter circuit INV5 has elapsed. Accordingly, the N-channel transistor MN3 enters an ON state. When the N-channel transistor MN3 becomes the ON state, the voltage of the output OUT2 is pulled down after a delay time TB5 of the output inverting unit 4 has elapsed and the level of the hold circuit 1 is inverted to "0."

When the output OUT2 becomes "0" level, the node N4 becomes "0" level after a delay time TB6 of the input unit 2 has elapsed, as shown in the truth table in FIG. 2. Following this, the N-channel transistor MN91 in the level shift circuit LS2 is turned off after a delay time TB7 of the level shift unit 3 has elapsed and the node N6 becomes the VDDQ level. As a result, the voltage at the node N7 is inverted by the inverter circuit INV5 to "0" level after a delay time TB8 of the inverter circuit INV5 and the N-channel transistor MN3 enters an OFF state. In this OFF state, the voltage of the output OUT2 is held at "0" level in the hold circuit 1.

In order to have the level shift circuits LS1 and LS2 operate even with a low VDD voltage, the dimension of the transistors needs to be set so that the on-resistance of the N-channel transistor MN91 is sufficiently lower than that of the P-channel transistors MP91 and MP92 when the voltage at the input end LSIN1 becomes VDD. Even when VDD drops near the threshold voltage of the N-channel transistor MN91, the level shift circuits LS1 and LS2 can operate if the dimension of the transistors be set so that the on-resistance of the N-channel transistor MN91 is lower than that of the P-channel transistors MP91 and MP92 and the voltage at the output end LSOUT1 can be pulled down.

When the dimension of the transistor is set as described above in the conventional circuit, the balance between the delay times of the rising and falling transitions deteriorates due to the poor rising transition, which fact is just as mentioned before. In contact thereto, the level shifter of the present invention will achieve the following effects.

As described, only the level shift circuit LS1 operates when the output OUT2 rises, and only the level shift circuit LS2 operates when the output OUT2 falls. When the level shift circuits LS1 and LS2 transfer the logical values of the input IN2 to the output OUT2, they both operate at (or with) the falling edge. The level shift circuits LS1 and LS2 operate at the rising edge only when the P-channel transistor MP5 or the N-channel transistor MN3 is turned off after the logical value of the output OUT2 has been determined, and there is no influence on the delay time from the input IN2 to the output OUT2.

In other words, even if the dimension of the transistors in the level shift circuits LS1 and LS2 is set so that they will operate at a low voltage, the logical value of the input IN2 will be transferred to the output OUT2 only at (with) the falling operation, and any poor rising operation of the level shift circuits LS1 and LS2 will give no influence on the delay time. Therefore, the balance between the delay times of the rising and falling operations will not deteriorate.

EXAMPLE 2

Figure 7:
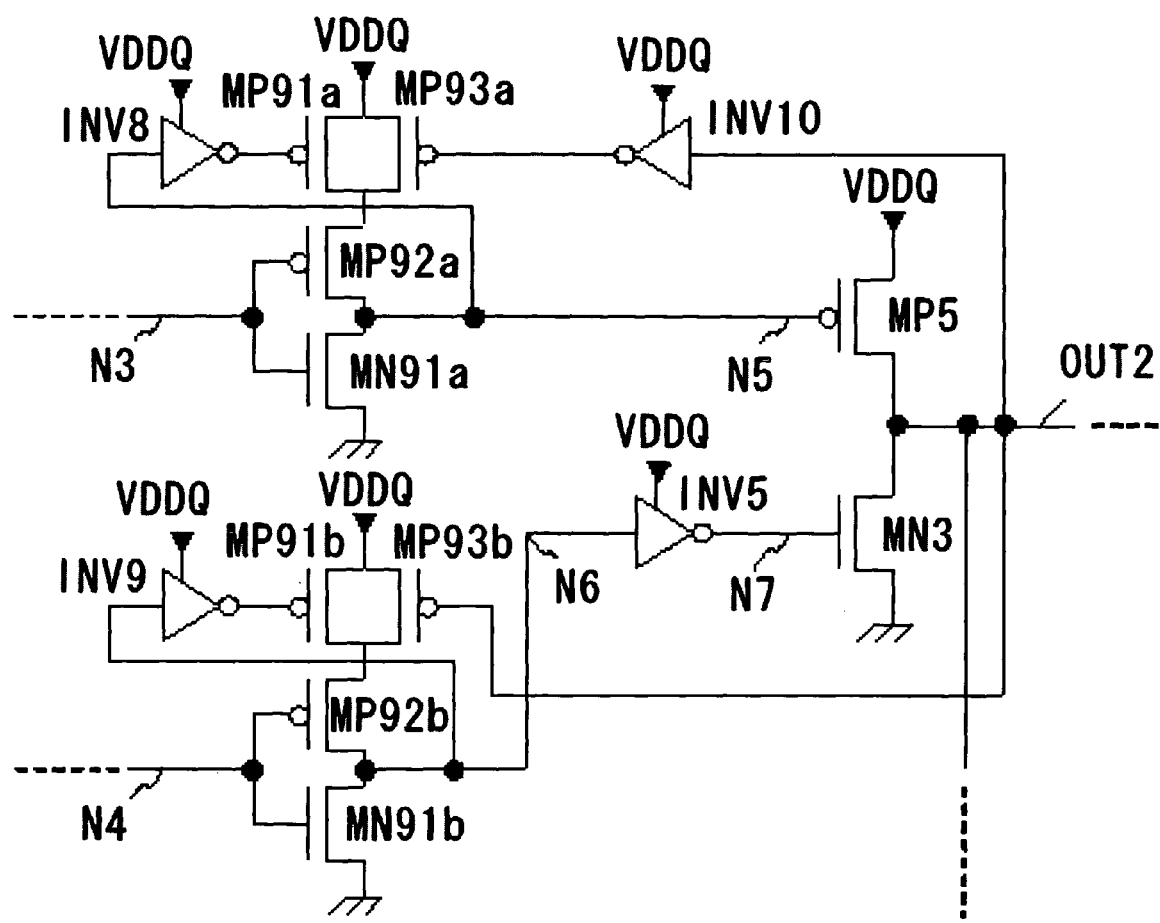
FIG. 7 is a circuit diagram of a main section of a level shifter relating to a second example of the present invention.
Figure 8:
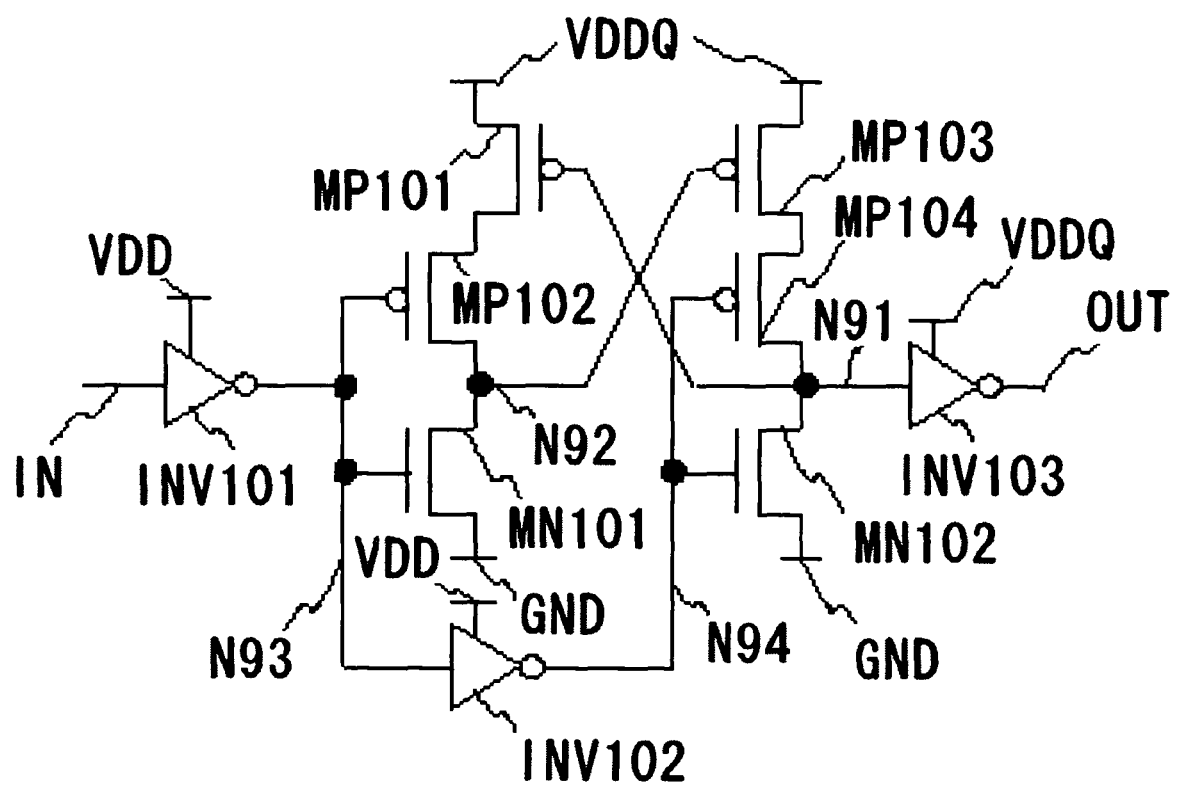
FIG. 8 is a circuit diagram of a reference circuit corresponding to the teaching a level shifter disclosed in Patent Document 1 (Related Art).
Figure 9:
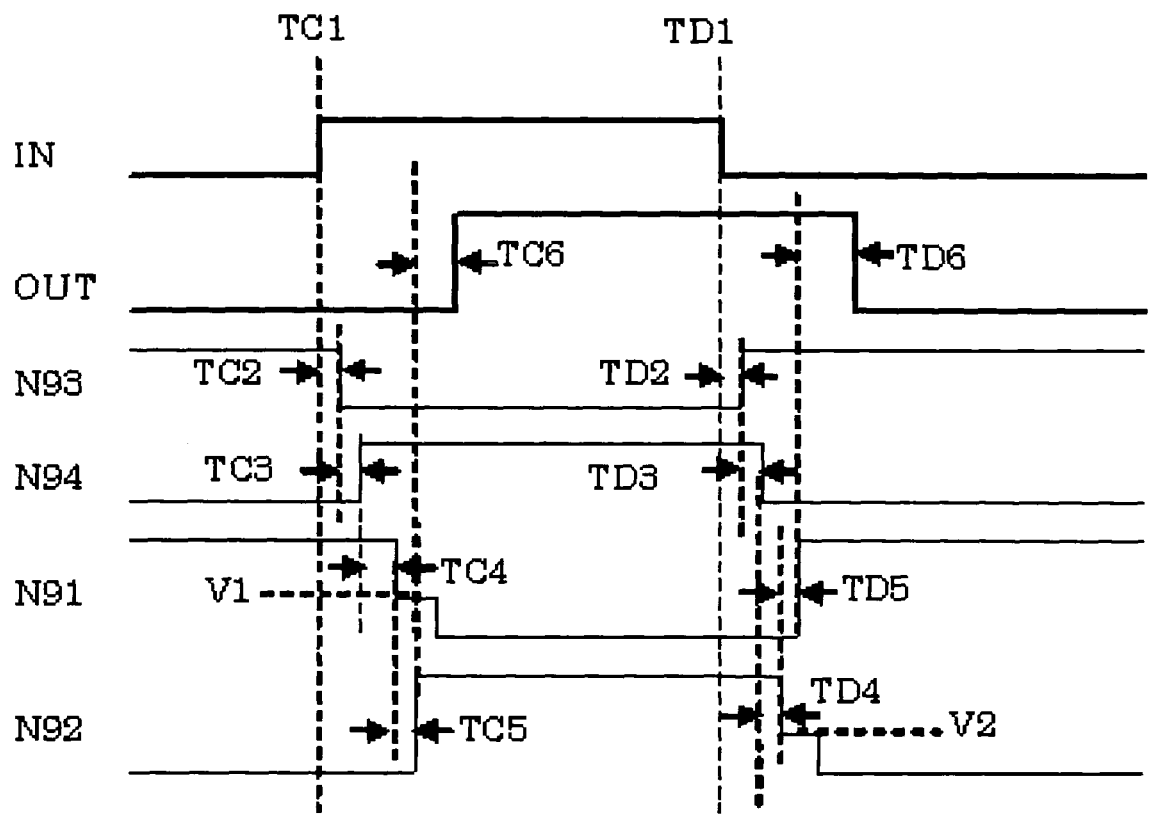
FIG. 9 is a timing chart of the reference circuit of FIG. 8, according to an analysis by the present invention.

FIG. 7 is a circuit diagram of a main section of a level shifter relating to a second example of the present invention. In the level shifter shown in FIG. 7, the level shift unit 3 and the output inverting unit 4 in FIG. 1 are modified, and only the modified parts are shown. 25 The other parts are the same as FIG. 1. In the level shifter shown in FIG. 7, P-channel transistors MP93a and MP93b, and inverter circuits INV8, INV9, INV10 are added to the level shift circuits LS1 and LS2 in FIG. 3. The inverter circuits INV8, INV9, and INV10 are all connected to the power supply VDDQ. Note that the N-channel transistors MN91a and MN91b are equivalents of the N-channel transistor MN91 in FIG. 3, and the P-channel transistors MP92a and MP92b are equivalents of the P-channel transistor MP92 in FIG. 3.

Further, instead of the P-channel transistor MP91 in FIG. 3, P-channel transistors MP91a and MP91b are provided respectively while gates of the P-channel transistors MP91a and MP91b are connected to other places. The gate of the P-channel transistor MP91a is connected to an output of the inverter circuit INV8 that outputs an inverted signal of the node N5. Further, the gate of the P-channel transistor MP91*b* is connected to an output of the inverter circuit INV9 that outputs an inverted signal of the node N6.

The P-channel transistor MP93*a* has its gate connected to an output of the inverter circuit INV10 that outputs an inverted signal of the output OUT2, its drain connected to a source of the P-channel transistor MP92*a*, and its source connected to VDDQ. The P-channel transistor MP93*b* has its gate connected to the output OUT2, its drain connected to a source of the P-channel transistor MP92*b*, and its source connected to VDDQ.

First, a case where the level at the node N4 rises will be described (after the time TB1 in FIG. 6). After the level at the node N4 rises, the output OUT2 falls as described above. Therefore, an initial voltage level of the output OUT2 is at VDDQ. The P-channel transistor MP93*b*, having its gate connected to the output OUT2, is in an OFF state at this time: Further, when the level at the node N4 rises, the level at the node N6 falls. Therefore, the initial voltage level at the node N6 is VDDQ (i.e., N4 is low). The P-channel transistor MP91*b*, having its gate connected to the inverted signal of the node N6, is in an ON state.

Once the level at the node N4 rises and the N-channel transistor MN91*b* enters an ON state, the P-channel transistor MP93*b* becomes an OFF state. Therefore, the voltage at the node N6 is the result of voltage division by the P-channel transistors MP91*b* and MP92*b*, and the N-channel transistor MN91*b*. In this state, the larger the on-resistance of the P-channel transistor MP91*b* is, the lower the voltage at the node N6 can be made. However, if the P-channel transistor MP91*b* stays in the ON state, the rising characteristics of the node N6 will deteriorate. Although this deterioration of the rising characteristics does not have any influence on the delay time from the input IN2 to the output OUT2, it translates into an increase in the duration (transition time) of the level shift operation.

The present example aims at (and provides) reducing this increased duration of the operation. The P-channel transistor MP91*b* is in the ON state in the initial state (the time TB1 in FIG. 6), but it enters an OFF state once the level at the node N6 falls. Then, when the output OUT2 falls, the P-channel transistor MP93*b* is turned on. By setting the dimension of the transistors so that the on-resistance of the P-channel transistor MP93*b* is lower than that of the P-channel transistor MP91*b*, a faster speed operation can achieved when the level at the node N4 falls and the level at the node N6 rises, compared to the case where the P-channel transistor MP91*b* pulls up the level.

The above explanation is about the path relating to the node N4, however, the operation concerning the path relating to the node N3 is performed in the same manner. The P-channel transistor MP93*a*, designed so that its on-resistance is lower than that of the P-channel transistor MP91*a*, receives the output OUT2 at its gate via the inverter circuit INV10 and turns on when the output OUT2 rises.

As described above, by employing the circuit configuration in which the on-resistances are changed (switched-over) from one to another between the rising (edge) and falling (edge) time, the duration (time length) of the level shift operation can be reduced. A transition to a next signal at the input IN2 cannot be made until the level shift operation is completed. Therefore, reducing the duration of the level shift operation is effective in having the level shifter operate at higher frequencies.

Further, since it is possible to greatly increase the on-resistances of the P-channel transistors MP91*a* and MP91*b*, the on-resistances of the N-channel transistors MN91*a* and MN91*b* can be increased as much (by the same extent). It means that it is possible to decrease the W-size (width) of the N-channel transistors MN91*a* and MN91*b*. Further, the increase in the on-resistance of the N-channel transistors MN91*a* and MN91*b* caused by the VDD voltage drop can be prevented better. As a result, the level shifter easily operates at a lower voltage.

Each disclosure of the aforementioned Patent Documents is incorporated herein by reference thereto.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A level shifter that converts an input signal having an amplitude between a ground and a first power supply voltage into an output signal having an amplitude between the ground and a second power supply voltage, said level shifter comprising:
    an input unit, driven by said first power supply voltage, that raises a first pulse signal at a rise of said input signal and raises a second pulse signal having the same polarity as said first pulse signal at a fall of said input signal;
    a level shift unit that includes a first level shift circuit that converts a signal level of said first pulse signal into an amplitude level of said second power supply voltage, and a second level shift circuit that converts a signal level of said second pulse signal into an amplitude level of said second power supply voltage;
    an output unit, driven corresponding to said first and second pulse signals whose levels have been converted, that generates said output signal and is operated by said second power supply voltage; and
    a hold unit that holds a level of said generated output signal and is operated by said second power supply voltage,
    wherein said input unit causes said first pulse signal to fall in response to a rise of said output signal and second pulse signal to fall in response to a fall of said output signal.

2. The level shifter as defined in claim 1, wherein said input unit determines whether or not the logic levels of said input signal and said output signal coincide with each other, and raises said first pulse signal corresponding to the rising edge of said input signal and said second pulse signal corresponding to the falling edge of said input signal when it is determined that the logic levels do not coincide; and
    the logic level of said output signal changes corresponding to the rise timing of said first and second pulse signals in said output unit.

3. The level shifter as defined in claim 1, wherein each of said first and second level shift circuits comprises:
    a transistor of a first conductivity type having its gate receiving said first and second pulse signals respectively, its source connected to a first power supply, and its drain outputs a pulse signal whose level has been shifted; and
    a first transistor of a second conductivity type having its gate connected to the gate of said transistor of the first conductivity type, its drain connected to the drain of said transistor of the first conductivity type, and its source connected to a second power supply via a connected transistor group; and said connected transistor group is formulated by one or more transistors of the second conductivity type.

4. The level shifter as defined in claim 3, wherein said connected transistor group comprises a second transistor of the second conductivity type having its gate connected to the gate of said transistor of the first conductivity type or to the ground, its drain connected to the source of said first transistor of the second conductivity type, and its source connected to said second power supply.

5. The level shifter as defined in claim 3, wherein said connected transistor group is formulated by a second transistor of the second conductivity type having its gate connected to the gate of said transistor of the first conductivity type or to the ground and its drain connected to the source of said first transistor of the second conductivity type; and a third transistor of the second conductivity type having its gate connected to the gate of said transistor of the first conductivity type or to the ground, its drain connected to the source of said second transistor of the second conductivity type, and its source connected to said second power supply.

6. The level shifter as defined in claim 3, wherein
said connected transistor group is formulated by:
a second transistor of the second conductivity type having its gate receiving an inverted signal of the drain of said transistor of the first conductivity type, its drain connected to the source of said first transistor of the second conductivity type, and its source connected to said second power supply; and
a third transistor of the second conductivity type having its gate receiving a signal associated with said output signal, its drain connected to the source of said first transistor of the second conductivity type, and its source connected to said second power supply;
wherein
an inverted signal of said output signal is supplied to the gate of said third transistor of the second conductivity type in case where said connected transistor group is included in said first level shift circuit; and
said output signal is supplied to the gate of said third transistor of the second conductivity type in case where said connected transistor group is included in said second level shift circuit.

7. The level shifter as defined in claim 1, wherein the input unit receives the output signal from the output unit to control the generated first and second pulse signals to fall.

8. The level shifter as defined in claim 1, wherein the input unit generates the first pulse signal according to determined logic levels of the output signal and input signal.

9. The level shifter as defined in claim 1, wherein said input unit determines whether the logic levels of the input signal and the output signal coincide with each other, and generates the first pulse signal corresponding to the rising edge of the input signal and the second pulse signal corresponding to the falling edge of the input signal when it is determined that the logic levels do not coincide.

10. The level shifter as defined in claim 1, wherein the logic level of the output signal changes corresponding to a generation timing of the first and second pulse signals in the output unit.

11. The level shifter as defined in claim 1, wherein each of said first and second level shift circuits comprises:
a transistor of a first conductivity type having its gate receiving said first and second pulse signals respectively, its source connected to a first power supply, and its drain output a pulse signal whose level has been shifted; and
a first transistor of a second conductivity type having its gate connected to the gate of said transistor of the first conductivity type, its drain connected to the drain of said transistor of the first conductivity type, and its source connected to a second power supply via a connected transistor group.

12. The level shifter as defined in claim 11, wherein the connected transistor group comprises a second transistor of the second conductivity type having its gate connected to the gate of said transistor of the first conductivity type or to the ground.

13. The level shifter as defined in claim 11, wherein the connected transistor group comprises:
a second transistor of the second conductivity type being connected to the transistor of the first conductivity type or connected to both the ground and the first transistor of the second conductivity type; and
a third transistor of the second conductivity type being connected to the transistor of the first conductivity type or connected to both the ground and the second transistor of the second conductivity type, and the second power supply providing power to the third transistor.

14. The level shifter as defined in claim 11, wherein the connected transistor group comprises:
a second transistor of the second conductivity type including a gate receiving an inverted signal of the drain of said transistor of the first conductivity type and receiving power from the second power supply; and
a third transistor of the second conductivity type including a gate receiving a signal associated with said output signal and receiving power from the second power supply.

15. A level shifter comprising:
an input unit, driven by a first power supply voltage, raises a first pulse signal at a rise of an input signal and generating a second pulse signal having a same polarity as said first pulse signal at a fall of said input signal, the input signal having an amplitude between a ground and a first power supply voltage;
a level shift unit including a first level shift circuit that converts a signal level of said first pulse signal into an amplitude level of a second power supply voltage, and a second level shift circuit that converts a signal level of said second pulse signal into an amplitude level of the second power supply voltage;
an output unit, driven corresponding to said first and second pulse signals including levels being converted, that generates an output signal having an amplitude between the ground and the second power supply voltage and is operated by the second power supply voltage; and
a hold unit holding a level of the generated output signal and is operated by the second power supply voltage,
wherein the input unit controls the first pulse signal to fall in response to a rise of said output signal, and second pulse signal to fall in response to a fall of the output signal from the output unit, and
wherein the input unit generates the first pulse signal according to determined logic levels of the output signal and input signal.

16. The level shifter as defined in claim 15, wherein the logic level of the output signal changes corresponding to the rise timing of the first and second pulse signals in the output unit.

17. The level shifter as defined in claim 15, wherein each of said first and second level shift circuits comprises a plurality of transistors of first and second conductivity type, the plurality of transistors comprising a transistor of a first conductivity type having its gate receiving said first and second pulse signals respectively, its source connected to a first power supply, and its drain output a pulse signal whose level has been shifted.

18. A method of a level shifter that converts an input signal having an amplitude between a ground and a first power supply voltage into an output signal having an amplitude between the ground and a second power supply voltage, the method comprising:

raising up a first pulse signal at a rise of an input signal by a first unit driven by the first power supply voltage;

raising up a second pulse signal having a same polarity as said first pulse signal at a fall of said input signal by the first unit;

converting, by a level shift unit that includes a first level shift circuit, a signal level of said first pulse signal into an amplitude of the second power supply voltage and a second level shift circuit that converts a signal level of said second pulse signal into an amplitude level of the second power supply voltage;

driving, by an output unit, corresponding to said first and second pulse signals whose levels have been converted, to generate the output signal and is operated by the second power supply voltage; and holding, by a holding unit, a level of said generated output signal and is operated by the second power supply voltage, wherein the input unit controls the first pulse signal to fall in response to a rise of the output signal and second pulse signal to fall in response to a fall of the output signal.

19. The method as defined in claim 18, wherein said input unit determines whether or not the logic levels of said input signal and said output signal coincide with each other, and raises said first pulse signal corresponding to the rising edge of said input signal and said second pulse signal corresponding to the falling edge of said input signal when it is determined that the logic levels do not coincide, and wherein the logic level of said output signal changes corresponding to the rise timing of said first and second pulse signals in said output unit.

20. The method as defined in claim 19, wherein each of said first and second level shift circuits comprises receiving, by a control electrode of a transistor of a first conductivity type, the first and second pulse signals, a source of the transistor being connected to a first power supply, and a drain of the transistor outputting a pulse signal having its level shifted.

* * * * *

UNITED STATES PATENT AND TRADEMARK OFFICE
CERTIFICATE OF CORRECTION

| | |
|---|---|
| PATENT NO. | : 7,772,883 B2 |
| APPLICATION NO. | : 12/219428 |
| DATED | : August 10, 2010 |
| INVENTOR(S) | : Hiroyuki Kuge |

It is certified that error appears in the above-identified patent and that said Letters Patent is hereby corrected as shown below:

Claim 11, Column 11, Line 65

~~output~~ outputs a pulse signal whose level has been shifted; and

Signed and Sealed this
Seventh Day of June, 2011

David J. Kappos
*Director of the United States Patent and Trademark Office*